(12) United States Patent
Katsuyama

(10) Patent No.: US 6,168,909 B1
(45) Date of Patent: Jan. 2, 2001

(54) MATERIAL AND METHOD FOR FORMING PATTERN

(75) Inventor: Akiko Katsuyama, Kyoto (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/392,583

(22) Filed: Sep. 9, 1999

(30) Foreign Application Priority Data

Sep. 10, 1998 (JP) .................................................. 10-256590

(51) Int. Cl.[7] .............................. G03F 7/213; G03F 7/30; G03C 5/56
(52) U.S. Cl. ...................... 430/326; 430/331; 430/905; 430/909; 430/270.1; 430/914
(58) Field of Search .................... 430/270.1, 906, 430/907, 909, 910, 905, 914, 325, 326, 331

(56) References Cited

U.S. PATENT DOCUMENTS 5,506,088 * 4/1996 Nozaki et al. .................... 430/270.1

FOREIGN PATENT DOCUMENTS

10115922 * 5/1998 (JP) .

OTHER PUBLICATIONS

Yamana 1998: 275000, File HCAPLUS of STN Database Service, Chemical Abstracts, American Chemical Society, 1998, p. 105–106 (English Abstract of JP10115922), May 6, 1998.*

* cited by examiner

Primary Examiner—Janet Baxter
Assistant Examiner—Sin J. Lee
(74) Attorney, Agent, or Firm—Nixon Peabody LLP; Eric J. Robinson

(57) ABSTRACT

A material for forming a pattern according to the present invention is a chemically amplified resist, which contains a resin and an acid generator that generates an acid when exposed to exposing radiation. The resin includes a derivative of poly(vinyl alcohol), a derivative of a vinylamine polymer, a derivative of poly(N-hydroxyethylaziridine), a derivative of polyhydroxycyclohexene or a copolymer including at least one of these derivatives.

2 Claims, 1 Drawing Sheet

MATERIAL AND METHOD FOR FORMING PATTERN

BACKGROUND OF THE INVENTION

The present invention generally relates to material and method for forming a resist pattern on a semiconductor substrate during a process of fabricating a semiconductor integrated circuit device. More specifically, the present invention relates to material and method for forming a fine-line resist pattern by exposing a chemically amplified resist to exposing radiation with a wavelength of 160 nm or less, such as vacuum ultraviolet radiation (VUV).

In a known method for forming a fine-line resist pattern by exposing a chemically amplified resist, deposited on a semiconductor substrate, to exposing radiation with a short wavelength, a KrF or ArF excimer laser (wavelength: 248 nm and 193 nm, respectively) is used as a source of the exposing radiation. As for the KrF excimer laser, a phenol resin was previously used as a resist material. On the other hand, as for the ArF excimer laser, an acrylic acid resin will be used as a resist material.

To form a fine-line resist pattern with a line width of 0.1 μm or less, however, an exposing radiation such as vacuum ultraviolet radiation with an even shorter wavelength than that of the KrF or ArF excimer laser, e.g., $F_2$ and $Kr_2$ excimer lasers, which both oscillate at wavelengths shorter than 160 nm (i.e., 157 and 147 nm, respectively), is preferably used.

Nevertheless, a chemically amplified resist containing a phenol or acrylic acid resin is highly absorptive with respect to the exposing radiation with a wavelength of 160 nm or less. Thus, it is difficult to apply such a material to a pattern forming method, in which a resist film is exposed to the radiation with a wavelength of 160 nm or less.

SUMMARY OF THE INVENTION

An object of the present invention is providing a material applicable to forming a resist pattern using the exposing radiation with a wavelength of 160 nm or less.

Another object of the present invention is providing a method for forming a resist pattern using such a material.

To achieve these objects, the present inventors performed intensive research to know the reason why a chemically amplified resist containing a phenol or acrylic acid resin is highly absorptive to the exposing radiation with a wavelength of 160 nm or less. As a result, we arrived at the conclusion that the high absorptance of the phenol or acrylic acid resin results from their double bonds of atoms like C=C and C=O.

Based on this finding, according to the present invention, a chemically amplified resist, which is based on a resin including no or at least substantially no double bonds of atoms like C=C and C=O, is used as a material for forming a resist pattern.

A first exemplary resin including no double bonds of atoms may be a derivative of a material represented by the following general chemical Formula 1:

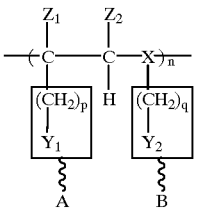

[Formula 1]

where at least one of the portions encircled by one-dot chains A and B should exist. That is to say, the material may include the portion A but not the portion B; include the portion B but not the portion A; or include both of these portions A and B.

In Formula 1, X may be either contained or not contained. If X is contained, then the X is N or C. $Y_1$ and $Y_2$ are of either the same or different species. At least one of $Y_1$ and $Y_2$ is a hydrophilic group (i.e., —OH or —NH$_2$). Otherwise, $Y_1$ or $Y_2$ is H. $Z_1$ and $Z_2$ are of either the same or different species and are —OH, —CH$_3$ or H. n is an integer equal to or larger than 1. And p and q are 0, 1, 2 or 3.

Examples of the first resin represented by Formula 1 include poly(vinyl alcohol), vinylamine polymer and poly(N-hydroxyethylaziridine).

Polyvinyl alcohol is a version represented by Formula 1, in which X is not contained, p is 0 and $Y_1$ is —OH (i.e., A is —OH).

Vinylamine polymer is another version represented by Formula 1, in which X is not contained, p is 0 and $Y_1$ is —NH$_2$ (i.e., A is —NH$_2$).

Poly(N-hydroxyethylaziridine) is still another version represented by Formula 1, in which X is N, p is 0 and $Y_1$ is —H (i.e., A is —H), q is 2 and $Y_2$ is —OH.

A second exemplary resin including no double bonds of atoms may be a derivative of a material represented by the following general chemical Formula 2:

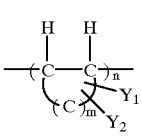

[Formula 2]

where at least one of $Y_1$ and $Y_2$ is —OH or —NH$_2$; $Y_1$ or $Y_2$, which is neither —OH nor —NH$_2$, is H or an alkyl group; and each of n and m is an integer equal to or larger than 1. Examples of the second resin represented by Formula 2 include polyhydroxycyclohexene.

A version of Formula 2, in which m is 4, may be represented by the following general chemical Formula 3:

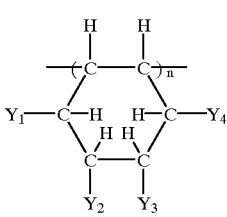

[Formula 3]

where one or two of $Y_1$, $Y_2$, $Y_3$ and $Y_4$ is/are —OH or NH$_2$.

A derivative of the resin represented by Formula 1, 2 or 3 may be obtained by substituting a chain or cyclic alkyl or alkoxyalkyl group for part or all of OH or NH$_2$.

Specifically, a material for forming a pattern according to the present invention is a chemically amplified resist containing: a resin; and an acid generator that generates an acid when exposed to exposing radiation. The resin includes a derivative of poly(vinyl alcohol), a derivative of a vinylamine polymer, a derivative of poly(N-hydroxyethylaziridine), a derivative of polyhydroxycyclohexene or a copolymer including at least one of these derivatives.

A method for forming a resist pattern according to the present invention includes the step of forming a resist film on a substrate by coating the substrate with a chemically amplified resist. The chemically amplified resist contains a resin and an acid generator that generates an acid when exposed to exposing radiation. The resin includes a derivative of poly(vinyl alcohol), a derivative of a vinylamine polymer, a derivative of poly(N-hydroxyethylaziridine), a derivative of polyhydroxycyclohexene or a copolymer including at least one of these derivatives. The method further includes the steps of: exposing the resist film to exposing radiation with a wavelength of 160 nm or less; and forming the resist pattern with a line width of 0.1 $\mu$m or less by developing the resist film exposed.

In the material and method for forming a pattern according to the present invention, examples of the resin that contains a derivative of poly(vinyl alcohol), a derivative of a vinylamine polymer, a derivative of poly(N-hydroxyethylaziridine), a derivative of polyhydroxycyclohexene or a copolymer including at least one of these derivatives include: any of these derivatives; a copolymer or mixture including at least one of these derivatives; a copolymer including at least one of these derivatives and poly(vinyl phenol), poly(methacrylic acid) or poly(acrylic acid); and a copolymer including at least one of these derivatives and a derivative of poly(vinyl phenol), poly(methacrylic acid) or poly(acrylic acid).

According to the present invention, the chemically amplified resist is based on a resin composed of monomer units including substantially no double bonds of atoms such as C=C or C=O, and therefore shows excellent transmittance to exposing radiation with a wavelength of 160 nm or less. Thus, in the exposed portions of the resist film, the exposing radiation can reach the bottom thereof. As a result, an acid is generated from the acid generator downward, i.e., from the surface toward the bottom of the resist film, with a lot more certainty. Consequently, a resist pattern can be formed exactly in its desired shape.

Examples of the acid generator include: onium salts such as sulfonium salts and iodonium salts; ester sulfonates; and diazodisulfonylmethanes.

Also, the material for forming a pattern may contain a solvent that can dissolve the resin, a basic compound such as an amine, or an additive such as a surfactant if necessary.

DESCRIPTION OF THE PREFERRED EMBODIMENTS

EMBODIMENT 1

Hereinafter, a pattern forming method according to a first embodiment of the present invention will be described with reference to FIGS. 1(a) through 1(d).

In the first embodiment, a pattern forming material containing a derivative of poly(vinyl alcohol) is used as a base resin. Following is an exemplary composition of the pattern forming material:

| | |
|---|---:|
| Polymer: poly(vinylalcohol-vinyloxybutane-hydroxyvinyl-oxynorbornene) | 2 g |
| Acid generator: triphenylsulfonium triflate | 0.01 g |
| Solvent: propyleneglycolmonoethylether acetate | 4 g |

Figure 1A:
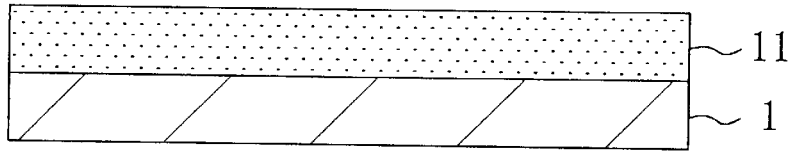
FIGS. 1(a), 1(b), 1(c) and 1(d) are cross-sectional views illustrating respective process steps for forming a resist pattern applicable to various embodiments of the present invention.
Figure 1B:
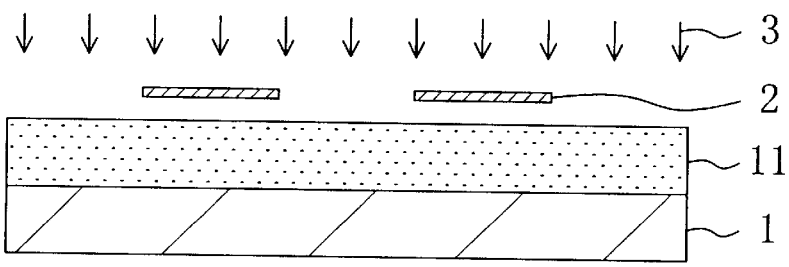

First, as shown in FIG. 1(a), a semiconductor substrate 1 is coated with a chemically amplified resist having the above composition, thereby forming a resist film 11 to be 0.3 $\mu$m thick, for example, on the substrate 1. Next, as shown in FIG. 1(b), the resist film 11 is exposed through a mask 2 to $F_2$ excimer laser light 3 (wavelength: 157 nm).

Figure 1C:
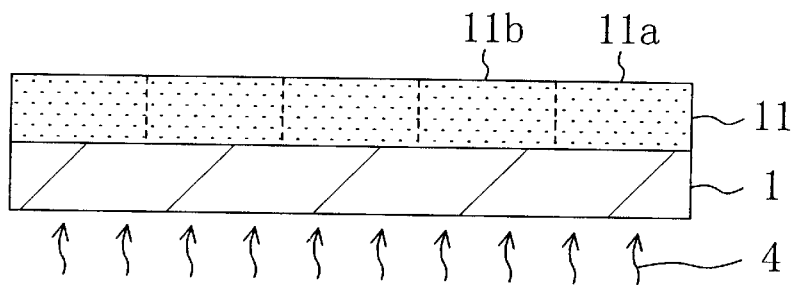

Then, as shown in FIG. 1(c), the semiconductor substrate 1 is heated by a hot plate as indicated by the arrows 4. As a result, an acid is generated from the acid generator in the exposed portions 11a of the resist film 11 to trigger a chemical reaction as represented by Formula 4, thereby changing these portions 11a from alkali insoluble into alkali soluble on the other hand, the non-exposed portions 11b of the resist film 11 remain alkali insoluble, because no acid has been generated from the acid generator and no chemical reaction represented by Formula 4 has been caused in those portions 11b.

[Formula 4]

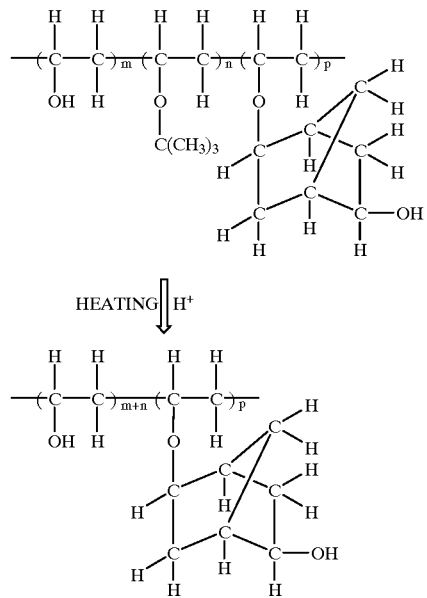

Figure 1D:
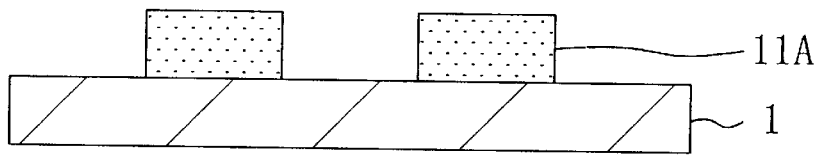

Next, when the resist film 11 is developed using an alkaline developer, the exposed portions 11a of the resist film 11 are dissolved in the developer. As a result, a fine-line resist pattern 11A with a line width of 0.1 $\mu$m is formed out of the non-exposed portions 11b of the resist film 11 as shown in FIG. 1(d).

In the pattern forming method according to the first embodiment, a pattern forming material containing a derivative of poly(vinyl alcohol) is used as a base resin. Since the base resin includes substantially no double bonds of atoms such as C=C and C=O, which easily absorb light with a wavelength of 160 nm or less, the pattern forming material shows excellent transmittance to the exposing radiation with a wavelength of 160 nm or less.

Accordingly, even if vacuum ultraviolet radiation with a wavelength of 160 nm or less is used as the exposing radiation, the exposing radiation still can reach the bottom of the exposed portions 11a of the resist film 11. Thus, in the exposed portions 11a of the resist film 11, an acid is generated from the acid generator downward, i.e., from the surface toward the bottom of the resist film 11, with a lot more certainty. As a result, a resist pattern can be formed exactly in its desired shape.

Also, according to the first embodiment, the base resin contains a polycyclic alkyl group, and therefore has excellent resistance to dry etching.

Furthermore, $F_2$ excimer laser light (wavelength: 157 nm) is used as the exposing radiation according to the first embodiment. However, the same effects are attainable if $Kr_2$ excimer laser light (wavelength: 147 nm) is used instead.

EMBODIMENT 2

Next, a pattern forming method according to a second embodiment of the present invention will be described.

In the second embodiment, a derivative of poly(N-hydroxyethylaziridine), e.g., poly(hydroxyethylaziridine-t-butoxyethylaziridine), is used as a base resin. The second embodiment is different from the first embodiment only in this respect, i.e., the base resin used.

The following chemical Formula 5 represents a chemical reaction, by which an acid generated from an acid generator changes poly(hydroxyethylaziridine-t-butoxyethylaziridine) into alkali soluble.

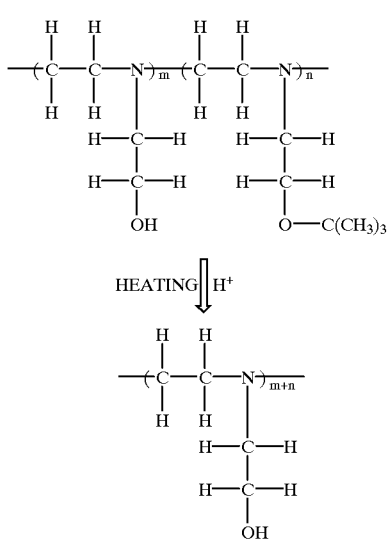

[Formula 5]

According to the second embodiment, the base resin includes substantially no double bonds of atoms such as C=C and C=O, either. Thus, even if vacuum ultraviolet radiation with a wavelength of 160 nm or less is used as the exposing radiation, the exposing radiation still can reach the bottom of the exposed portions of the resist film. Accordingly, in the exposed portions of the resist film, an acid is generated from the acid generator downward, i.e., from the surface toward the bottom of the resist film, with a lot more certainty. As a result, a resist pattern can be formed exactly in its desired shape.

EMBODIMENT 3

Next, a pattern forming method according to a third embodiment of the present invention will be described.

In the third embodiment, a derivative of polyhydroxycyclohexene, e.g., poly(dihydroxycyclohexene-ethoxyethoxycyclohexene), is used as a base resin. The third embodiment is different from the first embodiment only in this respect, i.e., the base resin used.

The following chemical Formula 6 represents a chemical reaction, by which an acid generated from an acid generator changes poly(dihydroxycyclohexene-ethoxyethoxycyclohexene) into alkali soluble.

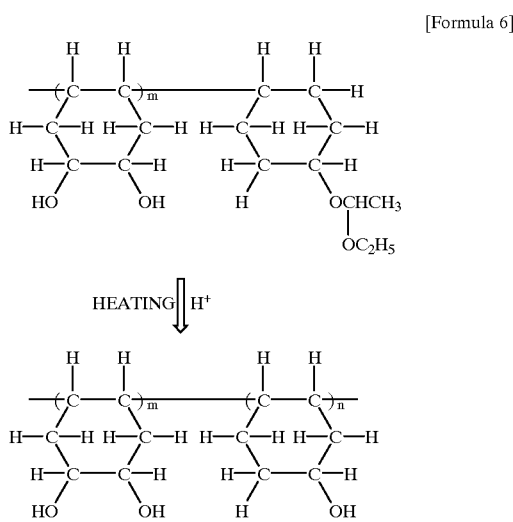

[Formula 6]

According to the third embodiment, the base resin includes substantially no double bonds of atoms such as C=C and C=O, either. Thus, even if vacuum ultraviolet radiation with a wavelength of 160 nm or less is used as the exposing radiation, the exposing radiation still can reach the bottom of the exposed portions of the resist film. Accordingly, in the exposed portions of the resist film, an acid is generated from the acid generator downward, i.e., from the surface toward the bottom of the resist film, with a lot more certainty. As a result, a resist pattern can be formed exactly in its desired shape.

Also, according to the third embodiment, the base resin contains a cyclic alkyl group at its principal chain, and therefore has excellent resistance to dry etching.

EMBODIMENT 4

Next, a pattern forming method according to a fourth embodiment of the present invention will be described.

In the fourth embodiment, a copolymer consisting of a derivative of poly(vinyl alcohol) and a derivative of polyhydroxycyclohexene, e.g., poly(hydroxycyclohexene-vinyloxyethoxyethane), is used as a base resin. The fourth embodiment is different from the first embodiment only in this respect, i.e., the base resin used.

The following chemical Formula 7 represents a chemical reaction, by which an acid generated from an acid generator changes poly(hydroxycyclohexene-vinyloxyethoxyethane) into alkali soluble.

[Formula 7]

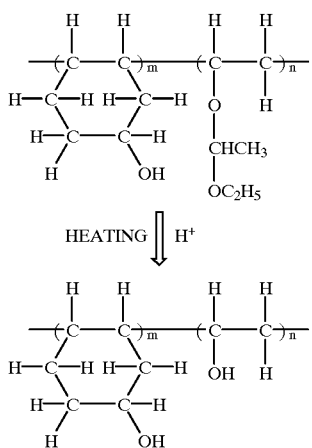

According to the fourth embodiment, the base resin includes substantially no double bonds of atoms such as C=C and C=O, either. Thus, even if vacuum ultraviolet radiation with a wavelength of 160 nm or less is used as the exposing radiation, the exposing radiation still can reach the bottom of the exposed portions of the resist film. Accordingly, in the exposed portions of the resist film, an acid is generated from the acid generator downward, i.e., from the surface toward the bottom of the resist film, with a lot more certainty. As a result, a resist pattern can be formed exactly in its desired shape.

Also, according to the fourth embodiment, the base resin contains a cyclic alkyl group at its principal chain, and therefore has excellent resistance to dry etching.

EMBODIMENT 5

Next, a pattern forming method according to a fifth embodiment of the present invention will be described.

In the fifth embodiment, a copolymer consisting of a derivative of poly(vinyl alcohol) and a derivative of a vinylamine polymer, e.g., poly(vinylamine-vinyloxybutane-hydroxyvinyloxynorbornene), is used as a base resin. The fifth embodiment is different from the first embodiment only in this respect, i.e., the base resin used.

The following chemical Formula 8 represents a chemical reaction, by which an acid generated from an acid generator changes poly(vinylamine-vinyloxybutane-hydroxyvinyloxynorbornene) into alkali soluble.

[Formula 8]

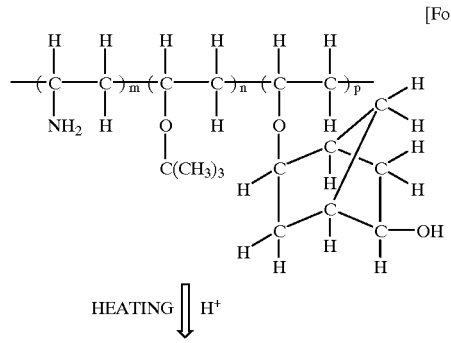

-continued

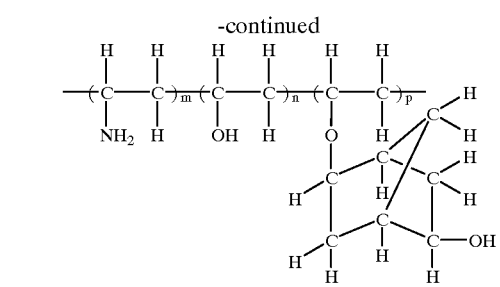

According to the fifth embodiment, the base resin includes substantially no double bonds of atoms such as C=C and C=O, either. Thus, even if vacuum ultraviolet radiation with a wavelength of 160 nm or less is used as the exposing radiation, the exposing radiation still can reach the bottom of the exposed portions of the resist film. Accordingly, in the exposed portions of the resist film, an acid is generated from the acid generator downward, i.e., from the surface toward the bottom of the resist film, with a lot more certainty. As a result, a resist pattern can be formed exactly in its desired shape.

Also, according to the fifth embodiment, the base resin contains a polycyclic alkyl group, and therefore has excellent resistance to dry etching.

EMBODIMENT 6

Next, a pattern forming method according to a sixth embodiment of the present invention will be described.

In the sixth embodiment, a copolymer consisting of a derivative of poly(vinyl alcohol) and a derivative of poly (methacrylic acid), e.g., poly(vinylalcohol-vinyloxybutane-hydroxyvinyloxybicyclooctane-butyl methacrylate), is used as a base resin. The sixth embodiment is different from the first embodiment only in this respect, i.e., the base resin used.

The following chemical Formula 9 represents a chemical reaction, by which an acid generated from an acid generator changes poly(vinylalcohol-vinyloxybutane-hydroxyvinyloxybicyclooctane-butyl methacrylate) into alkali soluble.

[Formula 9]

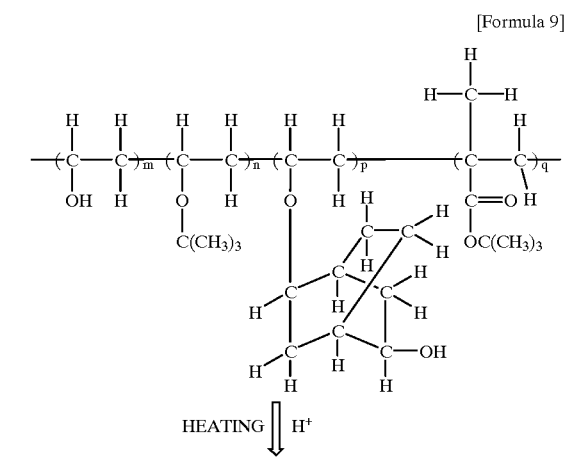

-continued

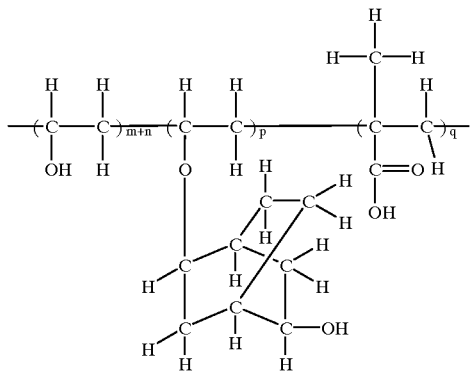

According to the sixth embodiment, the base resin contains a carbonyl group, and therefore shows certain absorptance against exposing radiation with a wavelength of 160 nm or less. However, since the ratio of monomer units containing the carbonyl group to the entire polymer is as low as about 10%, the transmittance of the resist film is not affected by these monomer units so much. Specifically, according to the sixth embodiment, when the thickness of the resist film is 0.3 μm, the transmittance of the resist film to light with a wavelength of 157 nm is 40% or more, which is high enough to form a desired resist pattern.

Also, according to the sixth embodiment, the base resin contains a polycyclic alkyl group, and therefore has excellent resistance to dry etching.

Furthermore, in the exposed portions of the resist film, the base resin is dissolved by the acid to form a carboxyl group, of which the solubility in an alkaline developer is very high. Accordingly, the dissolution rate of the exposed portions of the resist film in the developer makes an even sharper contrast with that of the non-exposed portions thereof. As a result, a resist pattern can be formed at an even higher resolution.

EMBODIMENT 7

Next, a pattern forming method according to a seventh embodiment of the present invention will be described.

In the seventh embodiment, a copolymer consisting of a derivative of poly(vinyl alcohol) and a derivative of poly (acrylic acid), e.g., poly(vinylalcohol-vinyloxybutane-hydroxyvinyloxynorbornene-butyl acrylate), is used as a base resin. The seventh embodiment is different from the first embodiment only in this respect, i.e., the base resin used.

The following chemical Formula 10 represents a chemical reaction, by which an acid generated from an acid generator changes poly(vinylalcohol-vinyloxybutane-hydroxyvinyloxynorbornene-butyl acrylate) into alkali soluble.

[Formula 10]

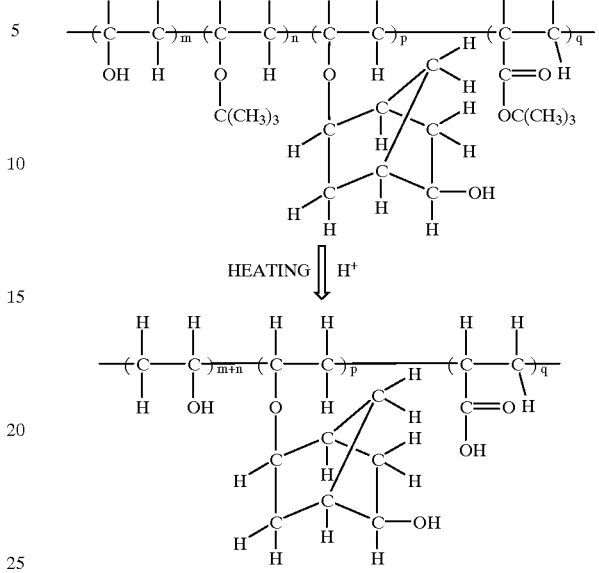

According to the seventh embodiment, the base resin contains a carbonyl group, and therefore shows certain absorptance against exposing radiation with a wavelength of 160 nm or less. However, since the ratio of monomer units containing the carbonyl group to the entire polymer is as low as about 10%, the transmittance of the resist film is not affected by these monomer units so much. Specifically, according to the seventh embodiment, when the thickness of the resist film is 0.3 μm, the transmittance of the resist film to light with a wavelength of 157 nm is 40% or more, which is high enough to form a desired resist pattern.

Also, according to the seventh embodiment, the base resin contains a polycyclic alkyl group, and therefore has excellent resistance to dry etching.

Furthermore, in the exposed portions of the resist film, the base resin is dissolved by the acid to form a carboxyl group. Accordingly, the dissolution rate of the exposed portions of the resist film in the developer makes an even sharper contrast with that of the non-exposed portions thereof. As a result, a resist pattern can be formed at an even higher resolution.

EMBODIMENT 8

Next, a pattern forming method according to an eighth embodiment of the present invention will be described.

In the eighth embodiment, a copolymer consisting of a derivative of poly(vinyl alcohol) and a derivative of poly (vinyl phenol), e.g., poly(vinylalcohol-vinyloxybutane-hydroxyvinyloxynorbornene-butoxystyrene), is used as a base resin. The eighth embodiment is different from the first embodiment only in this respect, i.e., the base resin used.

The following chemical Formula 11 represents a chemical reaction, by which an acid generated from an acid generator changes poly(vinylalcohol-vinyloxybutane-hydroxyvinyloxynorbornene-butoxystyrene) into alkali soluble.

[Formula 11]

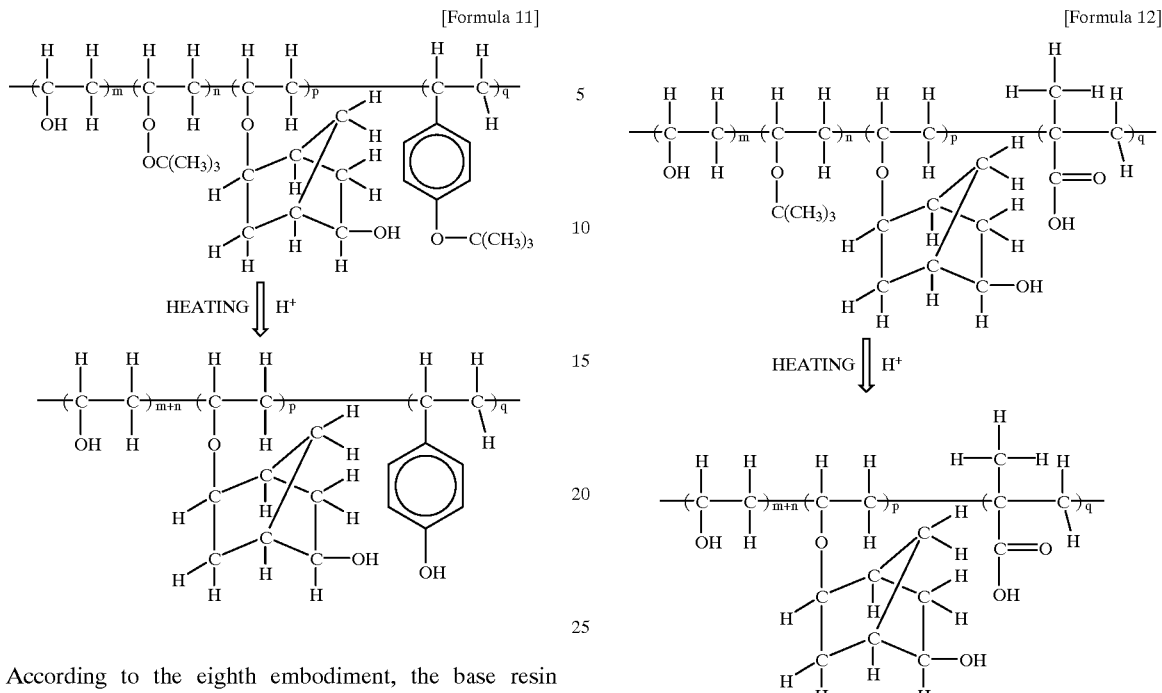

[Formula 12]

According to the eighth embodiment, the base resin contains an aromatic ring, and therefore shows certain absorptance against exposing radiation with a wavelength of 160 nm or less. However, since the ratio of monomer units containing the aromatic ring to the entire polymer is as low as about 15%, the transmittance of the resist film is not affected by these monomer units so much. Specifically, according to the eighth embodiment, when the thickness of the resist film is 0.3 μm, the transmittance of the resist film to light with a wavelength of 157 nm is 40% or more, which is high enough to form a desired resist pattern.

Also, according to the eighth embodiment, the base resin contains a polycyclic alkyl group, and therefore has excellent resistance to dry etching.

Furthermore, in the exposed portions of the resist film, the base resin is dissolved by the acid to form phenol, of which the solubility in an alkaline developer is very high. Accordingly, the dissolution rate of the exposed portions of the resist film in the developer makes an even sharper contrast with that of the non-exposed portions thereof. As a result, a resist pattern can be formed at an even higher resolution. In addition, the resistance of the resist film to dry etching is enhanced by the aromatic ring.

EMBODIMENT 9

Next, a pattern forming method according to a ninth embodiment of the present invention will be described.

In the ninth embodiment, a copolymer consisting of a derivative of poly(vinyl alcohol) and a derivative of poly (methacrylic acid), e.g., poly(vinylalcohol-vinyloxybutane-hydroxyvinyloxynorbornene methacrylate), is used as a base resin. The ninth embodiment is different from the first embodiment only in this respect, i.e., the base resin used.

The following chemical Formula 12 represents a chemical reaction, by which an acid generated from an acid generator changes poly(vinylalcohol-vinyloxybutane-hydroxyvinyloxynorbornene methacrylate) into alkali soluble.

According to the ninth embodiment, the base resin contains a carboxyl group, and therefore shows certain absorptance against exposing radiation with a wavelength of 160 nm or less. However, since the ratio of monomer units containing the carboxyl group to the entire polymer is as low as about 5%, the transmittance of the resist film is not affected by these monomer units so much. Specifically, according to the ninth embodiment, when the thickness of the resist film is 0.3 μm, the transmittance of the resist film to light with a wavelength of 157 nm is 40% or more, which is high enough to form a desired resist pattern.

Also, according to the ninth embodiment, the base resin contains a polycyclic alkyl group, and therefore has excellent resistance to dry etching.

Furthermore, the base resin contains a carboxyl group, and can be dissolved in the developer more easily. As a result, a resist pattern can be formed in its desired shape without forming any difficult-to-dissolve layer in the surface region of the resist film.

EMBODIMENT 10

Next, a pattern forming method according to a tenth embodiment of the present invention will be described.

In the tenth embodiment, a copolymer consisting of a derivative of poly(vinyl alcohol) and a derivative of poly (acrylic acid), e.g., poly(vinylalcohol-vinyloxytetrahydropyran-vinyloxybicyclooctane acrylate), is used as a base resin. The tenth embodiment is different from the first embodiment only in this respect, i.e., the base resin used.

The following chemical Formula 13 represents a chemical reaction, by which an acid generated from an acid generator changes poly(vinylalcohol-vinyloxytetrahydropyran-vinyloxybicyclooctane acrylate) into alkali soluble.

[Formula 13]

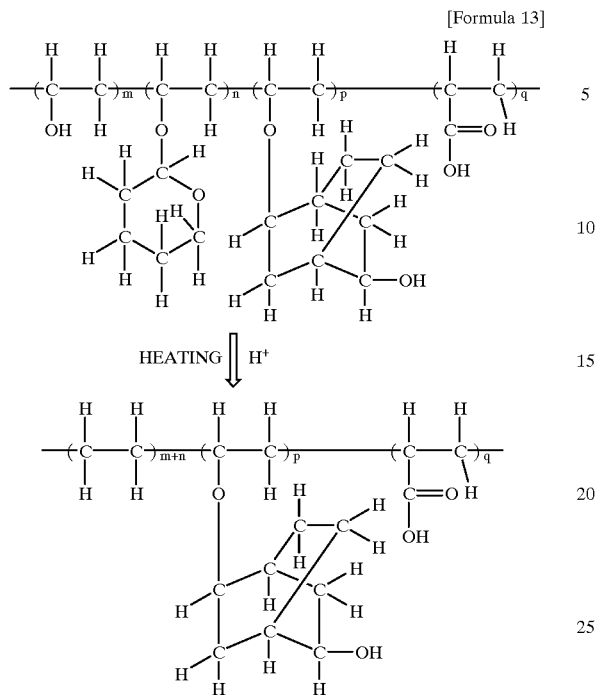

[Formula 14]

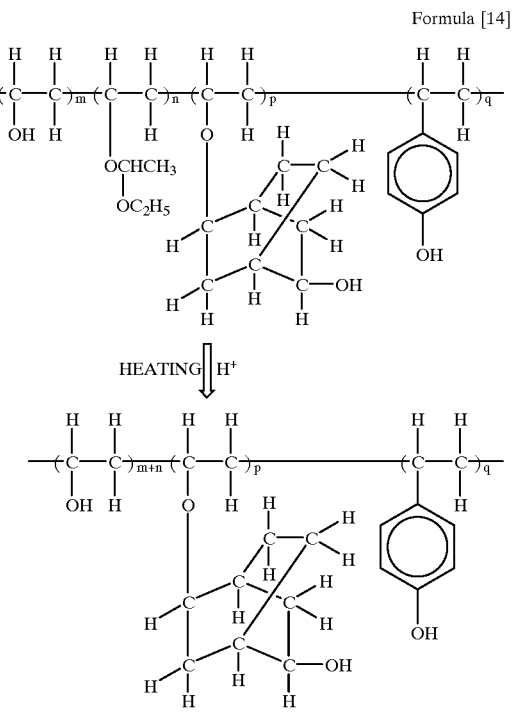

According to the tenth embodiment, the base resin contains a carboxyl group, and therefore shows certain absorptance against exposing radiation with a wavelength of 160 nm or less. However, since the ratio of monomer units containing the carboxyl group to the entire polymer is as low as about 5%, the transmittance of the resist film is not affected by these monomer units so much. Specifically, according to the tenth embodiment, when the thickness of the resist film is 0.3 μm, the transmittance of the resist film to light with a wavelength of 157 nm is 40% or more, which is high enough to form a desired resist pattern.

Also, according to the tenth embodiment, the base resin contains a polycyclic alkyl group, and therefore has excellent resistance to dry etching.

Furthermore, the base resin contains a carboxyl group, and can be dissolved in the developer more easily. As a result, a resist pattern can be formed in its desired shape without forming any difficult-to-dissolve layer in the surface region of the resist film.

EMBODIMENT 11

Next, a pattern forming method according to an eleventh embodiment of the present invention will be described.

In the eleventh embodiment, a copolymer consisting of a derivative of poly(vinyl alcohol) and a derivative of poly(vinyl phenol), e.g., poly(vinylalcohol-vinyloxyethoxyethane-hydroxyvinyloxybicyclooctane-hydroxystyrene), is used as a base resin. The eleventh embodiment is different from the first embodiment only in this respect, i.e., the base resin used.

The following chemical Formula 14 represents a chemical reaction, by which an acid generated from an acid generator changes poly(vinylalcohol-vinyloxyethoxyethane-hydroxyvinyloxybicyclooctane-hydroxystyrene) into alkali soluble.

According to the eleventh embodiment, the base resin contains an aromatic ring, and therefore shows certain absorptance against exposing radiation with a wavelength of 160 nm or less. However, since the ratio of monomer units containing the aromatic ring to the entire polymer is as low as about 5% or less, the transmittance of the resist film is not affected by these monomer units so much.

Also, according to the eleventh embodiment, the base resin contains a polycyclic alkyl group, and therefore has excellent resistance to dry etching.

Furthermore, the base resin contains a phenol group, and can be dissolved in the developer more easily. As a result, a resist pattern can be formed in its desired shape without forming any difficult-to-dissolve layer in the surface region of the resist film.

What is claimed is:

1. A method for forming a resist pattern, comprising the steps of:
   forming a resist film on a substrate by coating the substrate with a chemically amplified resist, the chemically amplified resist containing: a resin; and an acid generator that generates an acid when exposed to exposing radiation, the resin including a derivative of poly(vinyl alcohol), a derivative of a vinylamine polymer, a derivative of poly(N-hydroxyethylaziridine), a derivative of polyhydroxycyclohexene or a copolymer including at least one of these derivatives;
   exposing the resist film to exposing radiation with a wavelength of 160 nm or less; and
   forming the resist pattern with a line width of 0.1 μm or less by developing the resist film exposed.

2. A method of forming a resist pattern, comprising the steps of:
   forming a resist film on a substrate by coating the substrate with a chemically amplified resist, the chemically amplified resist containing a resin and an acid generator that generates an acid when exposed to exposing radiation;

exposing the resist film to exposing radiation with a wave length of 160 nm or less; and forming the resist pattern with a line width of 0.1 μm or less by developing the resist film exposed, wherein the resin is a co-polymer essentially consisting of an ingredient represented by Formula A or B and an ingredient represented by Formula C, the Formula A being:

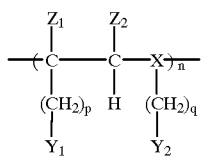

where:

X—$(CH_2)_q$—$Y_2$ is either contained or not contained;

$Y_1$ is —OH, —$NH_2$ or H;

when X—$(CH_2)_q$—$Y_2$ is contained, X is N or C and $Y_2$ is —OH or —$NH_2$;

$Z_1$ and $Z_2$ are of either the same or different species and are —OH, —$CH_3$ or H;

n is an integer equal to or larger than 1; and p and q are 0, 1, 2 or 3, the formula B being:

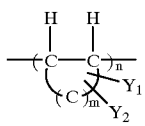

where:

at least one of $Y_1$ and $Y_2$ is —OH or —$NH_2$;

$Y_1$ or $Y_2$, which is neither —OH nor —$NH_2$, is H or an alkyl group; and each of n and m is an integer equal to or larger than 1, the Formula C being:

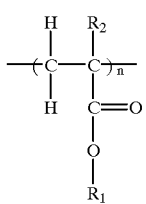

where:

$R_1$ is a chain or cyclic alkyl group, a chain or cyclic alkokyalkyl group or hydrogen; and $R_2$ is a methyl group or hydrogen.

\* \* \* \* \*